United States Patent
Feilchenfeld et al.

(10) Patent No.: US 10,535,551 B2
(45) Date of Patent: Jan. 14, 2020

(54) LATERAL PIN DIODES AND SCHOTTKY DIODES

(71) Applicant: GLOBALFOUNDRIES INC., Grand Cayman (KY)

(72) Inventors: Natalie B. Feilchenfeld, Jericho, VT (US); Vibhor Jain, Essex Junction, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/919,744

(22) Filed: Mar. 13, 2018

(65) Prior Publication Data
US 2018/0204761 A1    Jul. 19, 2018

Related U.S. Application Data

(62) Division of application No. 14/476,185, filed on Sep. 3, 2014, now Pat. No. 9,947,573.

(51) Int. Cl.
| | |
|---|---|
| *H01L 21/762* | (2006.01) |
| *H01L 27/08* | (2006.01) |
| *H01L 29/06* | (2006.01) |
| *H01L 29/165* | (2006.01) |
| *H01L 29/66* | (2006.01) |
| *H01L 29/868* | (2006.01) |
| *H01L 29/872* | (2006.01) |
| *H01L 29/16* | (2006.01) |
| *H01L 29/161* | (2006.01) |

(52) U.S. Cl.
CPC .... *H01L 21/76224* (2013.01); *H01L 27/0814* (2013.01); *H01L 29/0649* (2013.01); *H01L 29/165* (2013.01); *H01L 29/66136* (2013.01); *H01L 29/868* (2013.01); *H01L 29/872* (2013.01); *H01L 29/0619* (2013.01); *H01L 29/161* (2013.01); *H01L 29/1608* (2013.01)

(58) Field of Classification Search
CPC ........... H01L 29/66136; H01L 29/8611; H01L 29/868; H01L 29/872; H01L 29/0649; H01L 27/0814; H01L 21/76224; H01L 21/76264; H01L 21/76283; H01L 21/7682
See application file for complete search history.

(56) References Cited

U.S. PATENT DOCUMENTS

| 4,925,805 A | * | 5/1990 | van Ommen | ..... H01L 21/76232 257/347 |
|---|---|---|---|---|
| 5,438,220 A | | 8/1995 | Nakagawa et al. | |
| 5,445,107 A | * | 8/1995 | Roth | ....................... C30B 1/023 438/481 |
| 6,049,109 A | * | 4/2000 | Omura | ................... H01L 29/868 257/347 |
| 6,307,232 B1 | | 10/2001 | Akiyama et al. | |
| 6,429,500 B1 | * | 8/2002 | Greenberg | ........ H01L 29/66098 257/436 |

(Continued)

*Primary Examiner* — David C Spalla
(74) *Attorney, Agent, or Firm* — Anthony Canale; Andrew M. Calderon; Roberts Mlotkowski Safran Cole & Calderon, P.C.

(57) ABSTRACT

Lateral PiN diodes and Schottky diodes with low parasitic capacitance and variable breakdown voltage structures and methods of manufacture are disclosed. The structure includes a diode with breakdown voltage determined by a dimension between p-and n-terminals formed in an i-region above a substrate.

18 Claims, 6 Drawing Sheets

(56) References Cited

U.S. PATENT DOCUMENTS

| | | | |
|---|---|---|---|
| 6,617,670 B2 * | 9/2003 | Taylor | H01L 29/868 257/458 |
| 6,949,454 B2 | 9/2005 | Swanson et al. | |
| 7,190,046 B2 | 3/2007 | Akatsu et al. | |
| 7,335,927 B2 | 2/2008 | Coolbaugh et al. | |
| 8,288,244 B2 | 10/2012 | Collins et al. | |
| 8,338,265 B2 | 12/2012 | Coolbaugh et al. | |
| 8,421,181 B2 | 4/2013 | Anderson et al. | |
| 8,519,478 B2 * | 8/2013 | Rassel | G06F 17/5068 257/335 |
| 8,592,293 B2 | 11/2013 | Johnson et al. | |
| 8,999,849 B1 | 4/2015 | Lin et al. | |
| 2002/0100950 A1 | 8/2002 | Babcock et al. | |
| 2005/0124167 A1 | 6/2005 | Nevin et al. | |
| 2006/0043526 A1 * | 3/2006 | Lutz | G11C 17/16 257/529 |
| 2006/0180892 A1 | 8/2006 | Pardoen | |
| 2007/0176252 A1 | 8/2007 | Coolbaugh et al. | |
| 2008/0087978 A1 | 4/2008 | Coolbaugh et al. | |
| 2011/0298092 A1 | 12/2011 | Chuang | |
| 2012/0313144 A1 | 12/2012 | Zhang et al. | |
| 2013/0026611 A1 | 1/2013 | Kellener et al. | |
| 2014/0131710 A1 * | 5/2014 | Chung | H01L 29/66113 257/49 |
| 2015/0091129 A1 * | 4/2015 | Gambino | H01L 21/7624 257/507 |
| 2016/0118378 A1 * | 4/2016 | Wu | H01L 29/402 327/534 |

* cited by examiner

LATERAL PIN DIODES AND SCHOTTKY DIODES

FIELD OF THE INVENTION

The invention relates to semiconductor structures and, more particularly, to lateral PiN diodes and Schottky diodes with low parasitic capacitance and variable breakdown voltage structures and methods of manufacture.

BACKGROUND

High speed PiN diodes are built in a vertical configuration. In such a configuration, the high speed PiN diodes need a dedicated epi Si process for the i-layer, which sets up the breakdown voltage of the diodes. However, different breakdown voltages would need different epi Si thickness, making it very difficult to integrate PiN diode of various breakdown voltages on the same chip. In addition, vertical PiN diodes have high N to substrate capacitance, which ultimately limits its speed.

Schottky barrier diodes (SBD) are another type of high speed diode used in mm wave high speed-Si technologies. These types of diodes need a p-guard ring to reduce leakage current. These p-guard rings, though, increase parasitic capacitance of the diodes, limiting the speed. Accordingly, there are a number of issues related to both high speed PiN diodes and SBDs, e.g., limited number of breakdown voltages with standard formation of PIN diode; and high SBD p+ guard ring–n capacitance.

SUMMARY

In an aspect of the invention, a structure comprises a diode with breakdown voltage determined by a dimension between p- and n-terminals formed in an i-region above a substrate.

In an aspect of the invention, a structure comprises: a substrate; an i-region comprising one of i-Si, i-SiGe, i-SiGeC, and i-SiC, formed above the substrate; a first lateral PiN diode comprising a first p-terminal formed in the i-region at a first distance from a first n-terminal formed in the i-region; and a second lateral PiN diode comprising a second p-terminal formed in the i-region at a second distance from a second n-terminal formed in the i-region. The first distance is greater than the second distance. The first distance forms a high breakdown voltage region for the first lateral PiN diode. The second distance forms a low breakdown voltage region for the second lateral PiN diode.

In an aspect of the invention, a method comprises: forming p-terminals and n-terminals in an i-region at different distances to form a high breakdown voltage region and a low breakdown voltage region in an underlying substrate; etching an opening into the substrate; selectively etching a lateral undercut in the underlying substrate, under at least the p-terminals to remove its direct connection to the underlying substrate; and at least partially filling the lateral undercut under the at least the p-terminals with insulation material to provide an isolation structure under the at least the p-terminals.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
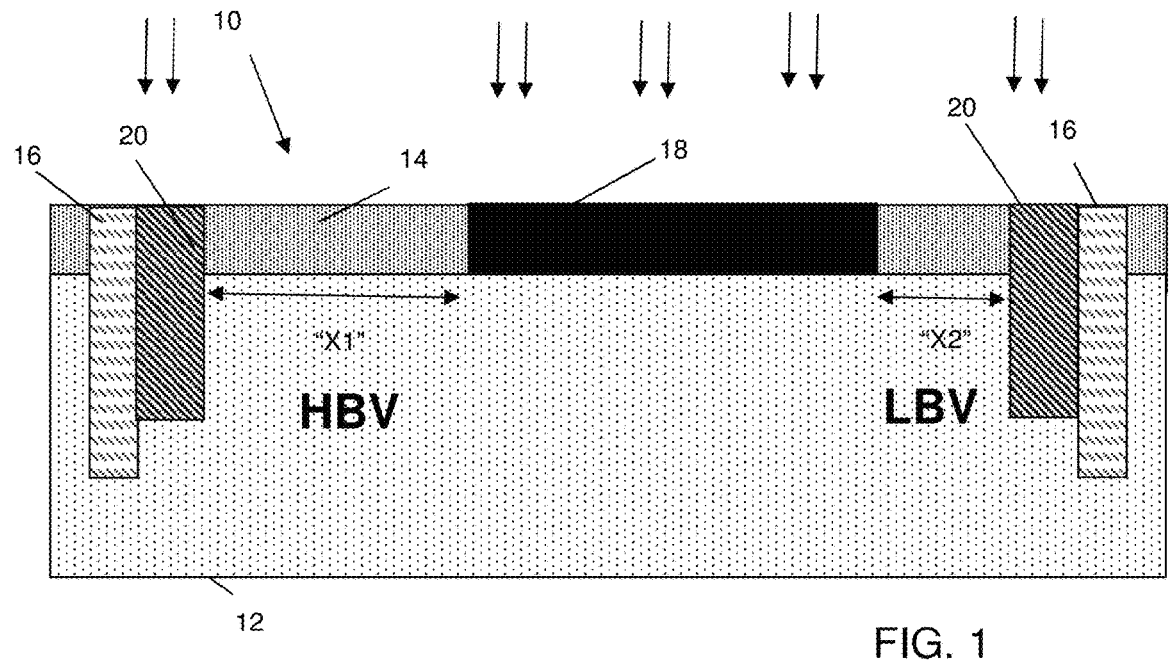
FIGS. 1-4 show structures and respective processing steps in accordance with an aspect of the present invention.

The invention relates to semiconductor structures and, more particularly, to lateral PiN diodes and Schottky diodes with low parasitic capacitance and variable breakdown voltage structures and methods of manufacture. In embodiments, the lateral PiN diode has at least one terminal with a buried isolation. Also, the present invention can be directed to vertical Schottky barrier diodes (SBD) with a same type of isolation (e.g., not a terminal, but a p+ guard ring).

More specifically, the present invention relates to a lateral PiN diode (LPiN) with a breakdown voltage determined by the lateral dimension of i-region/spacing between p- and n-terminals, where the i-region may comprise i-Si, i-SiGe, i-SiGeC or i-SiC, and the p-terminal and/or the n-terminal and/or complete lateral PiN diode is isolated from a substrate upon which the lateral PiN diode is formed. The present invention is applicable to CMOS, RFCMOS, BiCMOS devices.

Advantageously, by implementing the processes of the present invention it is now possible to provide scalable distance between p- and n-terminals to allow for multiple breakdown voltages, while only using a single mask step. The present invention also provides reduced capacitance between p-/n-terminals and the substrate. Also, the present invention overcomes the known issues of vertical PiN diodes by, for example, (i) placing the PiN diodes in a lateral configuration, (ii) using selective etch to cut off the link between PiN terminal(s) and the substrate to increase speed, and (iii) using a single mask to set various spaces between p- and n-terminals so that various breakdown voltages of the lateral PiN diodes can be achieved. For the SBD, the parasitic capacitance between a p–guard ring and ohmic contact region (n-type cathode) is reduced by using selective Si etch.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Even more specifically, the present invention takes advantage of different types of selective etching processes for isolation of p- and n-terminals. For example, the present invention can take advantage of the following:

(i) etch Si selective to p-Si (boron doping≥2E19);

(ii) etch Si selective to SiGe (Ge %≥10%) or SiGeC or SiC;

(iii) etch Si selective to implanted n+-Si, prior to rapid thermal anneal (RTA); and/or (iv) etch Si selective to n++-Si (P-type doping≥1E20).

Thus, by implementing the processes of the present invention, it is possible to provide the following methods:

(i) a method to introduce selective etch of Si to the process flow of lateral PiN diode;

(ii) a method to introduce a trench etch next to a p-terminal and/or n-terminal prior to the selective Si etch;

(iii) a method to etch out silicon underneath p- and/or n-terminals or to remove its direct connection to the underlying substrate; and (iv) a method to deposit dielectrics to fill or partially fill cavities (e.g., undercuts) and trenches, and pinch-off trenches to seal the isolation structures.

In this way, it is now possible to form the following structures by way of illustrative examples:

(i) Lateral PiN diode (LPiN) with breakdown voltage determined by the lateral dimension of i-region/spacing between p- and n-terminals, where the i-region can be any of i-Si, i-SiGe, i-SiGeC, i-SiC;

(ii) Lateral PiN diode with a p-terminal and/or n-terminal and/or complete structure isolated from the substrate by utilizing an etch;

(iii) Lateral PiN diode with SiGe n-terminal, both p- and n-terminal isolated from substrate; LPiN with SiGe terminals, isolated from substrate;

(iv) Lateral PiN diode with a thin SiGe underneath terminals and isolated from substrate;

(v) Lateral PiN diode with self-aligned terminals; and/or (vi) Vertical SBD with undercut below the p+ guard ring for reduced parasitic capacitance.

FIGS. 1-4 show structures and respective processing steps in accordance with an aspect of the present invention. More specifically, FIG. 1 shows a structure 10 having a substrate 12. The substrate may be composed of Si material. In embodiments, the substrate 12 can have a low doping profile on the order of less than 2E19, and preferably on the order of about 2E15. An i-region (i-Si) layer 14 is formed directly on the substrate 12. As described further herein, the layer 14 can also be i-SiGe, i-SiGeC or i-SiC, depending on subsequent processes. In the embodiment shown in FIGS. 1-4, for example, the i-Si layer 14 can be epitaxially grown Si material, using processes known to those of skill in the art such that further explanation is not required for an understanding of the present invention.

Still referring to FIG. 1, deep trench isolation structures 16 can be formed through i-Si layer 14 into the substrate 12 using conventional lithography, etching and deposition processes. For example, a resist formed on the i-Si layer 14 is exposed to energy (e.g., light) to form a pattern. An etching process, e.g., reactive ion etching (RIE) with appropriate chemistry is then performed through the pattern to form deep trenches corresponding to the pattern. The resist can be removed using conventional stripping processes, e.g., oxygen ashing processes or other stripants. The trenches can then be filled with insulator material, e.g., oxide based materials. Any residual material can be stripped using, e.g., chemical mechanical polishing (CMP).

A P-type region 18 and a N-type region 20 are formed in the i-Si layer 14 using ion implantation processes. In embodiments, the P-type region 18 and the N-type region 20 are formed in separate ion implantation processes, using separate masks, with the P-type region 18 and the N-type region 20 formed in any order. In embodiments, the P-type region 18 will form the anode of a lateral diode; whereas, the N-type region 20 will form the cathode of the lateral diode. In embodiments, the P-type region 18 is formed by a boron implantation process, while the N-type regions 20 are formed by a phosphorous, and/or arsenic and/or antimony implantation process. The boron implantation process should be provided at a doping level of 2E19 or greater. In this way, the P-type region 18 can be resistant to a subsequent etching process, which forms undercuts in the substrate 12. In embodiments, the implantation processes can be followed by a conventional annealing process to activate the P-type region 18 and the N-type regions 20.

As further shown in FIG. 1, spacing between edges of the P-type region 18 and the N-type regions 20 can vary by adjusting the spacing of the masks, shown representatively by "X1" and "X2". These spaces "X1" and "X2" are representative of a high breakdown voltage (HBV) region and a low breakdown voltage (LBV), respectively. By adjusting this spacing, with masking during the implanting process, the scaling of "X1" and "X2" can be adjusted in order to tailor the regions for different applications.

Figure 2:
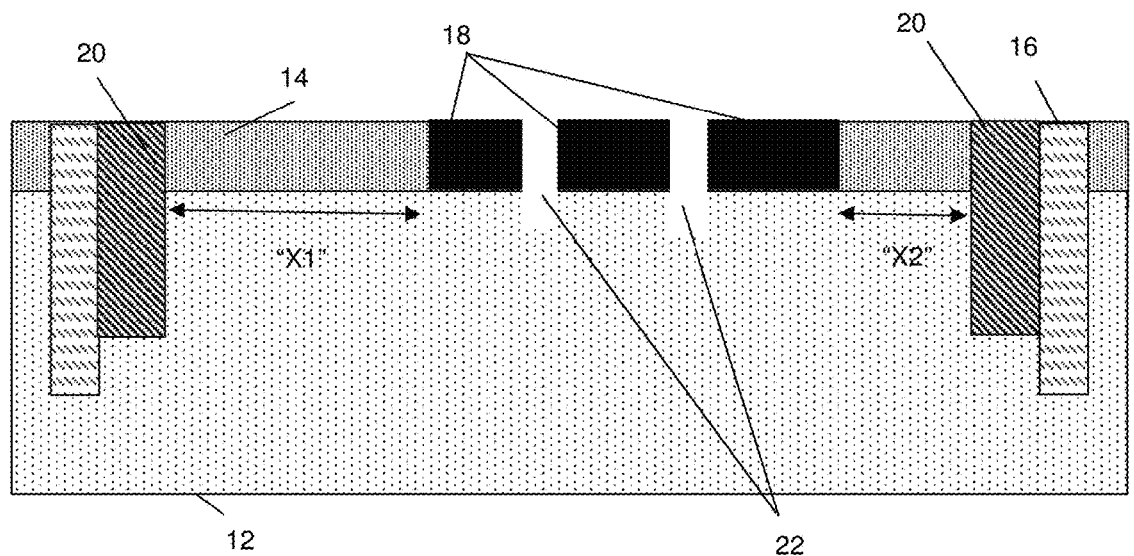

In FIG. 2, an etching process is performed to form shallow openings 22 through the P-type region 18, thereby forming a plurality of P-type regions 18, e.g., anodes. In embodiments, the etch process is an anisotropic etch which extends through the P-type region 18 and into the substrate 12. The etching can be performed using conventional lithography and etching processes as already described herein.

Figure 3:
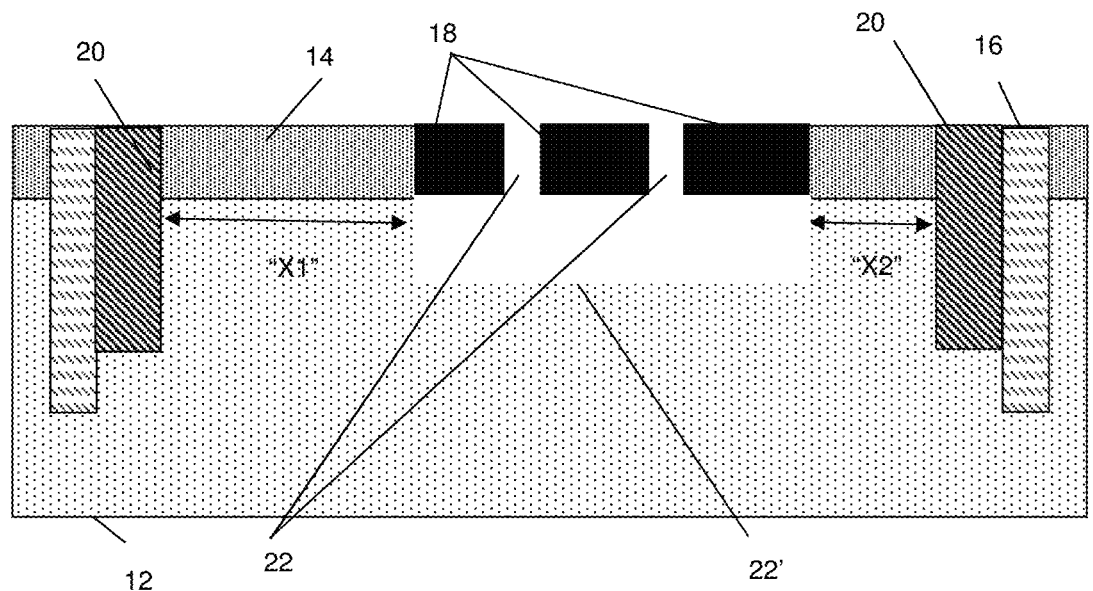

As shown in FIG. 3, the anisotropic etch is followed by a lateral etching process, selective to the substrate 12 to form undercuts 22' in the substrate 12 under the P-type regions 18, e.g., anodes. In embodiments, the lateral etching process is performed using a selective etch chemistry which removes material such that the P-type regions 18 (and in alternative or additional embodiments, the N-type regions 20) are no longer in direct connection to the substrate 12. More specifically, the etch chemistry is a KOH etch based chemistry or similar etchant that is selective to the substrate 12, e.g., Si material. It should be understood that the P-type regions 18, e.g., anodes, are resistant to this etchant process due to the high energy boron implantation process, e.g., 2E19 or greater. Accordingly, in this way the undercuts 22' can be formed under the P-type regions 18, e.g., anodes. (It should be understood by those skilled in the art that other exposed silicon regions, e.g., layers 14 and 20, need to be covered with an etch protect mask.)

Figure 4:
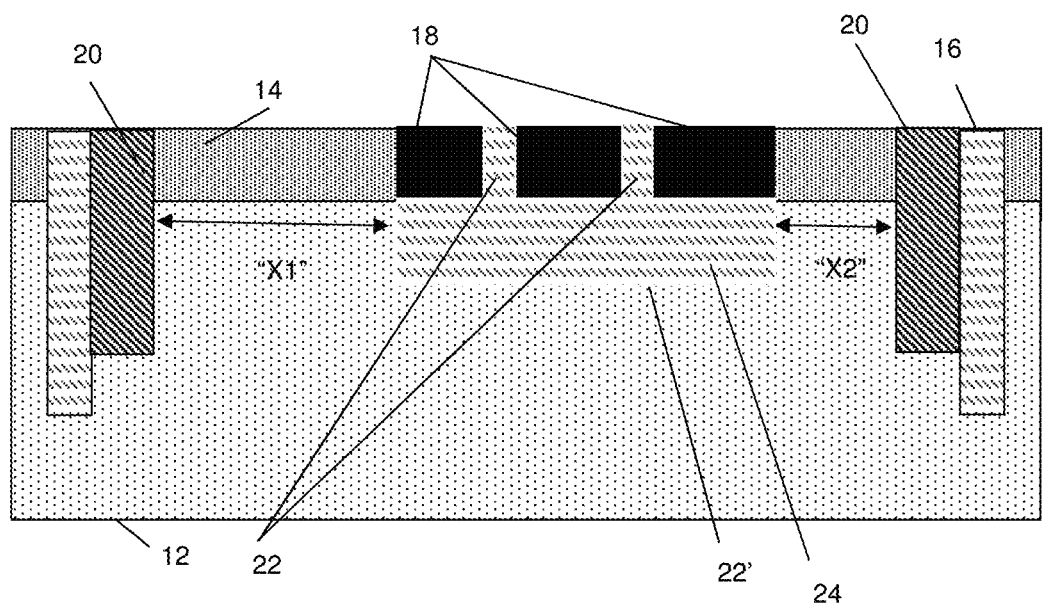

In FIG. 4, the openings 22 and undercuts 22' are filled with an insulation material 24 to isolate the P-type regions 18, e.g., anodes, from the substrate 12. In embodiments, the insulation material can be an oxide based material or Boron Phosphate Silicate Glass (BPSG), deposited using conventional deposition processes, e.g., chemical vapor deposition (CVD) or plasma enhanced CVD (PECVD). In this way, using a single epi thickness, e.g., thickness of layer 14, it is now possible to achieve different voltage breakdown regions (HBV or (LBV) with a single masking process.

FIGS. 5-13 show different structures and respective processing steps in accordance with additional aspects of the present invention. More specifically, in FIG. 5, the structure $10^i$ includes N-type regions 20 (cathodes) which are implanted or doped with Ge or Ar or other material. This makes N-type regions 20 (cathodes) resistant to a later undercut etching process, similar to that described above. In this embodiment, annealing can also be delayed to a later stage.

As in the processes of FIGS. 1-4, an anisotropic etching can be performed to form shallow openings through the P-type region 18, thereby forming a plurality of P-type regions 18 (anodes). In addition, this anisotropic etching can be performed on the sides of the N-type regions 20 (cathodes). The anisotropic etch is followed by a lateral etching process, selective to the substrate 12, to form undercuts in the substrate 12 under the P-type regions 18 (anodes) and the N-type regions 20 (cathodes).

As already described, the lateral etching process is performed using a selective etch chemistry, e.g., a KOH etch based chemistry or similar etchant that is selective to the substrate 12, e.g., Si material. As the N-type regions 20 have been altered with, e.g., Ge or As, and the P-type regions 18 have been modified by the high energy boron implantation process, e.g., 2E19 or greater, both the N-type regions 20 (cathodes) and the P-type regions 18 (anodes) are resistant to this lateral etchant process, thereby allowing the formation of the undercuts under both the N-type regions 20 (cathodes) and the P-type regions 18 (anodes). A rapid thermal anneal can be performed to repair damage of the N-type regions 20 (cathode).

Figure 5:
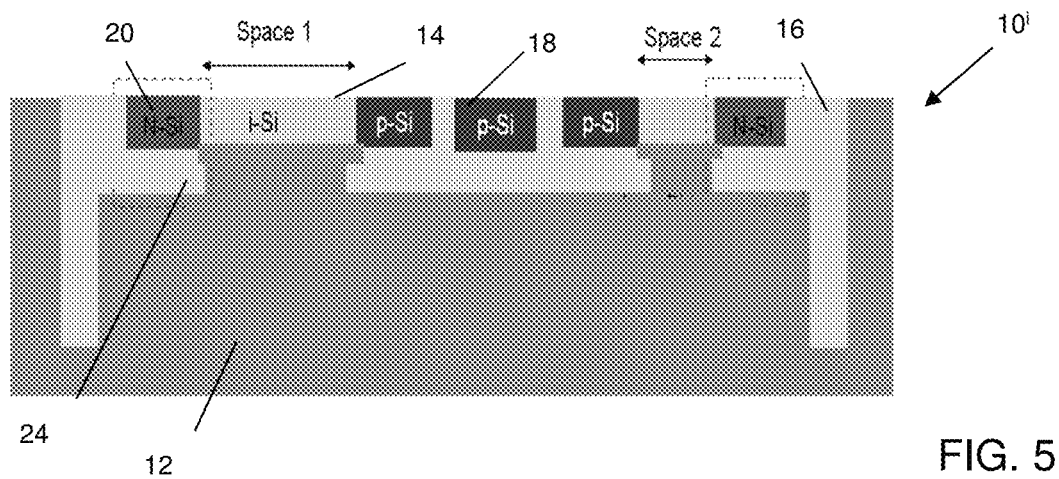
FIG. 5 shows a structure and respective processing steps in accordance with additional aspects of the present invention.

Still referring to FIG. 5, the openings and undercuts are filled with an insulation material 24 to isolate the P-type regions 18 and the N-type regions 20 from the substrate 12. In embodiments, the insulation material can be an oxide based material or Boron Phosphate Silicate Glass (BPSG), depositing using conventional deposition processes, e.g., chemical vapor deposition (CVD) or plasma enhanced CVD (PECVD). In this way, using a single epi thickness, e.g., thickness of layer 14, it is now possible to achieve different voltage breakdown regions (HBV or (LBV) with a single masking process.

Figure 6:
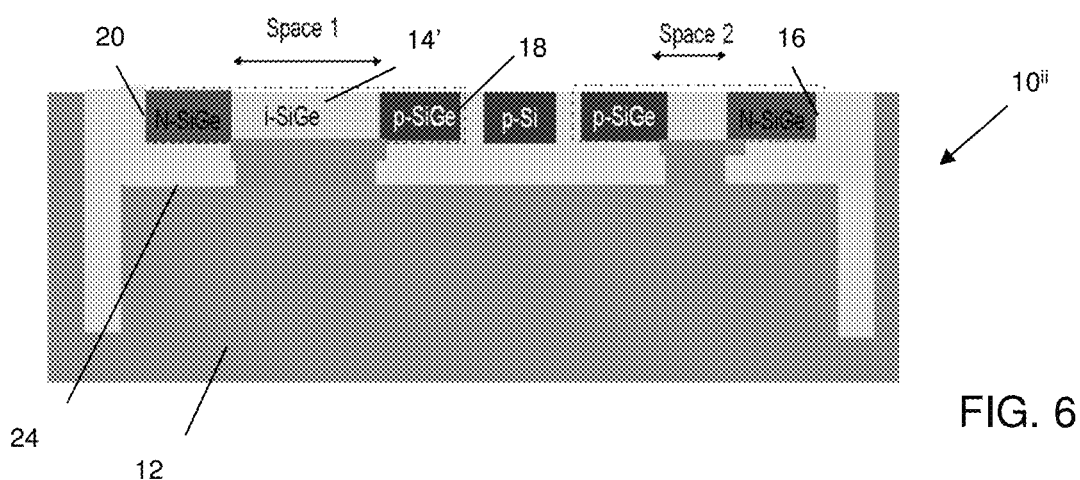
FIG. 6 shows a structure and respective processing steps in accordance with additional aspects of the present invention.

In FIG. 6, the structure (lateral PiN diode)$10^{ii}$ includes an epi SiGe layer 14' (instead of i-Si layer); although other materials are also contemplated by the present invention. For example, the epi layer 14' can be i-SiGeC or i-SiC or other materials selective to the substrate 12. In embodiments, Ge %≥10% and, in alternative embodiments, C %≥1%. In this way, the PiN diodes can now be provided on the i-SiGe, i-SiGeC, i-SiC layer 14', with an undercut performed selective to the substrate 12 (Si layer) to form an isolation between the substrate and the N-type regions 20 (cathodes) and P-type regions 18 (anodes).

In FIG. 6, the N-type regions 20 (cathodes) and the P-type regions 18 (anodes) are not altered/modified as described in the different embodiments of FIGS. 1-5. However, due to the deposition of the epi layer 14', which provides etching selectivity to substrate 12, it is now possible to laterally undercut the N-type regions 20 (cathodes) and the P-type regions 18 (anodes) using a selective etching process. It should be understood by those of skill in the art that the layer 14', e.g., i-SiGe, i-SiGeC or i-SiC, provides selectivity to Si during a lateral undercut etching processes. (In embodiments, Ge %≥10% and/or C %≥1%.) In alternative embodiments, N-type regions 20 (cathodes) and/or the P-type regions 18 (anodes) can also be modified/altered, in combination with the SiGe layer 14'. After the etching processes, the openings and undercuts are filled with an insulation material 24 to isolate the P-type regions 18 and the N-type regions 20 (p-terminal and n-terminal) from the substrate 12. In embodiments, the insulation material can be an oxide based material or Boron Phosphate Silicate Glass (BPSG), as already described herein. In this way, using a single epi thickness, e.g., thickness of layer 14', it is now possible to achieve different voltage breakdown regions (HBV or (LBV) with a single masking process.

Figure 7:
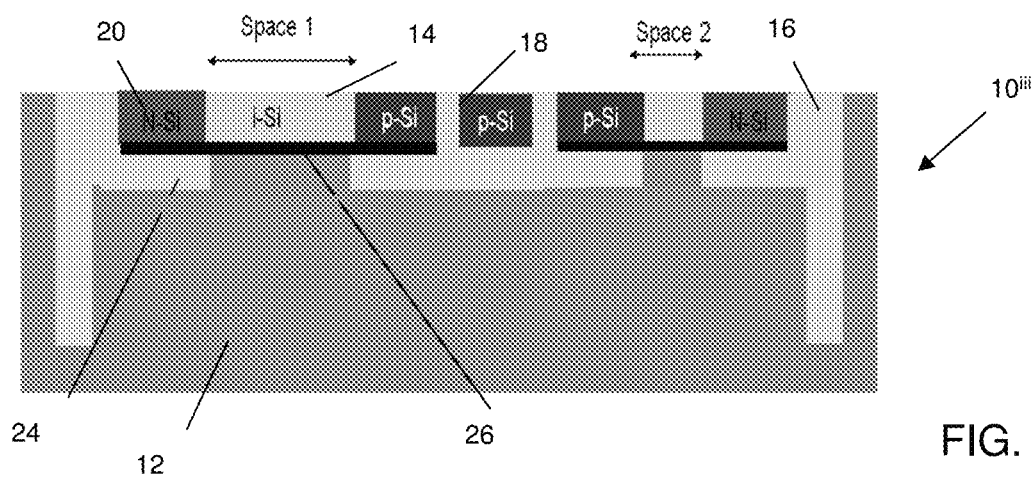
FIG. 7 shows a structure and respective processing steps in accordance with additional aspects of the present invention.

In FIG. 7, the structure (lateral PiN diode)$10^{iii}$ includes a SiGe etch stop layer 26 formed under the epi layer 14 (e.g., between the substrate 12 and the layer 14). In embodiments, the etch stop layer 26 can also be other materials selective to the substrate 12, e.g., SiGeC or SiC. It should be understood by those of skill in the art that the layer 26, e.g., SiGe, SiGeC or SiC, can provide etching selectivity to Si during a lateral undercut etching processes, as already described herein. That is, the etch stop layer 26 will act as a barrier layer to protect the N-type regions 20 (cathodes) and the P-type regions 18 (anodes) during the lateral undercut etching processes.

In embodiments, the N-type regions 20 (cathodes) and the P-type regions 18 (anodes) are not altered/modified as described in the different embodiments of FIGS. 1-5. In alternative embodiments, the N-type regions 20 (cathodes) and/or the P-type regions 18 (anodes) can also be modified/altered, in combination with the etch stop layer 26. After the etching processes, the openings and undercuts are filled with an insulation material 24 to isolate the P-type regions 18 and the N-type regions 20 (p-terminal and n-terminal) from the substrate. In embodiments, the insulation material can be an oxide based material or Boron Phosphate Silicate Glass (BPSG), as already described herein.

Figure 8:
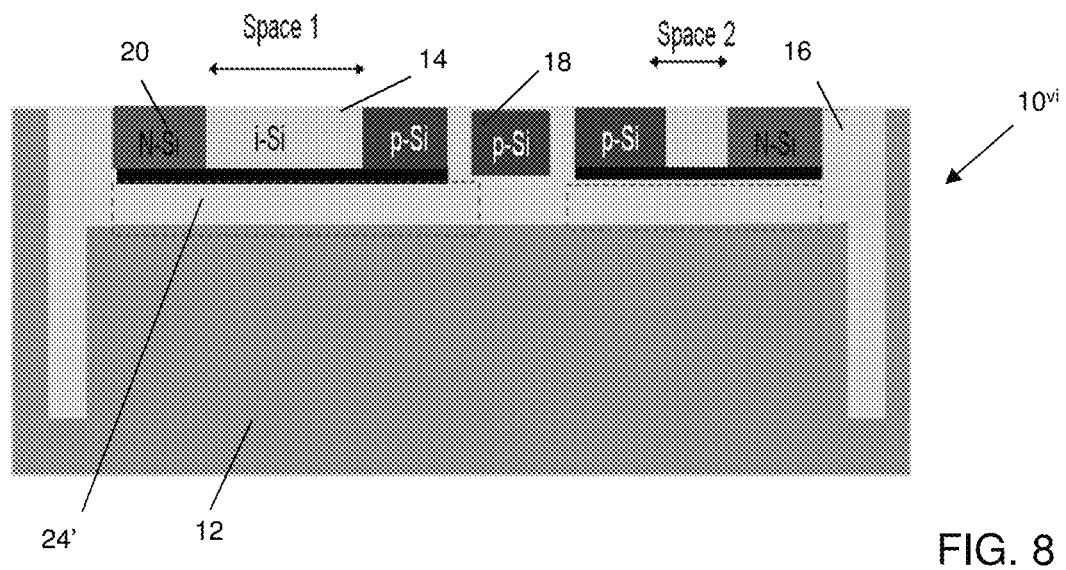
FIG. 8 shows a structure and respective processing steps in accordance with additional aspects of the present invention.

In FIG. 8, the structure (lateral PiN diode) $10^{iv}$ includes a lateral undercut (isolation region 24') that extends entirely across the epi layer 14 between the isolation structures 16, e.g., under the P-type regions 18 and the N-type regions 20 (p-terminal and n-terminal). The openings and undercuts are filled with an insulation material to isolate the P-type regions 18 and the N-type regions 20 (p-terminal and n-terminal) from the substrate, forming the isolation region 24'. In this way, the lateral PiN diode is completely isolated. In embodiments, the insulation material can be an oxide based material or Boron Phosphate Silicate Glass (BPSG), as already described herein.

Figure 9:
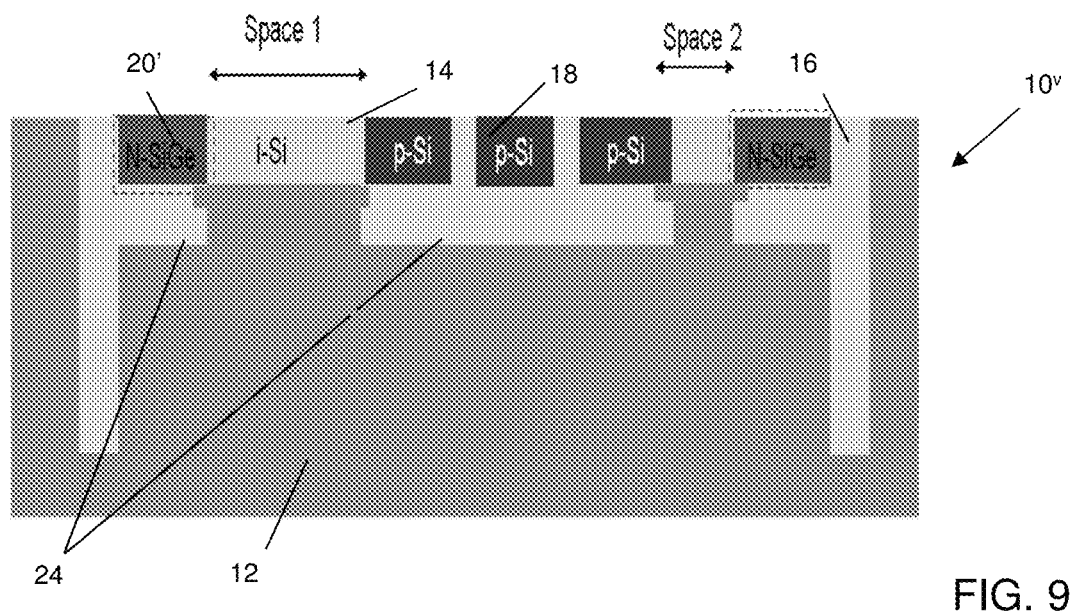
FIG. 9 shows a structure and respective processing steps in accordance with additional aspects of the present invention.

In FIG. 9, the (lateral PiN diode) structure $10^v$ includes N-type regions 20' comprising SiGe. In embodiments, the Ge %≥10%. In alternative embodiments, the N-type regions 20' can also be heavily doped with phosphorous or arsenic with an energy level of ≥2E20 to provide the required selectivity (similar to the use of high energy boron for the P-type regions 18). In embodiments, the remaining structure and processes are the same as, e.g., shown in FIG. 5 or 6. In alternative embodiments, the structure undercut can extend entirely across the epi layer 14 between the isolation structures 16, as shown in FIG. 8. In this embodiment, the N-type regions 20' are formed by a selective epitaxy SiGe process for the cathode area, e.g., N-type regions 20'. The selective epitaxy of SiGe N-type regions 20' will provide etching selectivity to Si during the lateral undercut etching processes.

Figure 10:
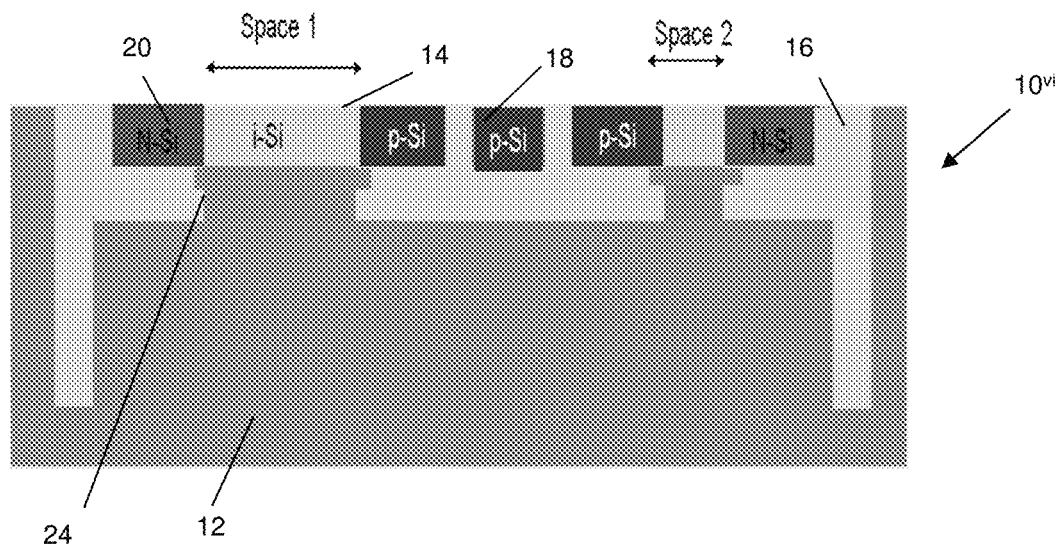
FIG. 10 shows a structure and respective processing steps in accordance with additional aspects of the present invention.

In FIG. 10, the structure (lateral PiN diode) $10^{vi}$ is fabricated by a single photolithography step. In this way, the space 1 ("X1"), space 2 ("X2"), as well as the P-type regions 18 and the N-type regions 20 (p-terminal and n-terminal) can be defined by the single photolithography step. Also, all of the terminals are in self-alignment.

Figure 11:
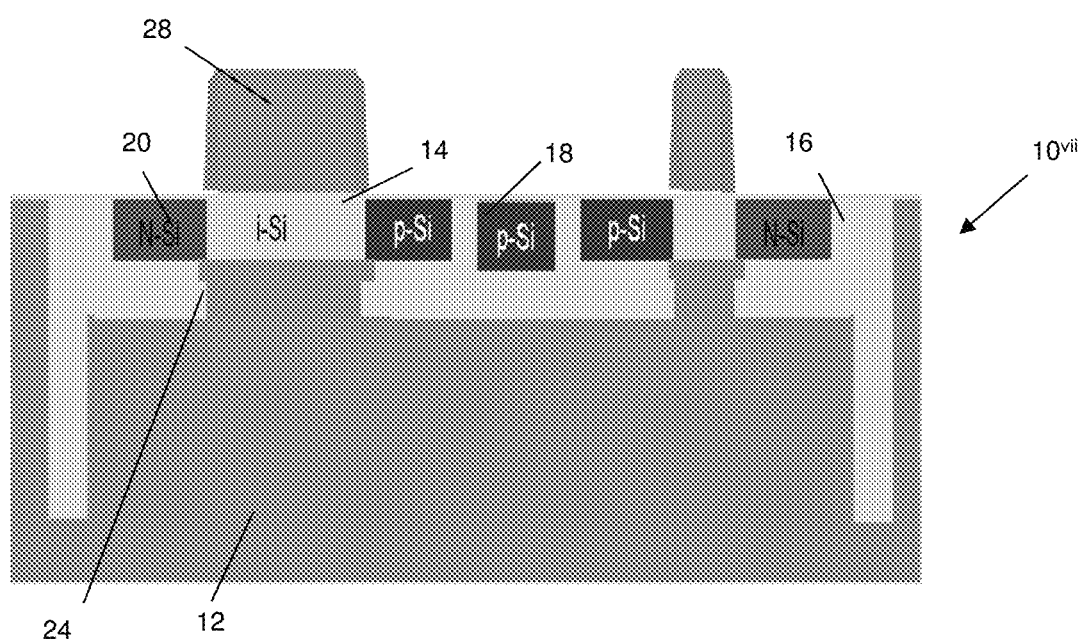
FIG. 11 shows a structure and respective processing steps in accordance with additional aspects of the present invention.

In FIG. 11, the structure (lateral PiN diode) $10^{vii}$ includes transistor gates 28 fabricated using conventional CMOS processes. The transistor gates 28 can be floating, which define the space between the P-type regions 18 and the N-type regions 20 (p-terminal and n-terminal). The P-type regions 18 and the N-type regions 20 can also be fabricated in combination with the processes described above, in order to provide the needed selectivity to form the undercuts, e.g., isolation structures 24 between the P-type regions 18 and the N-type regions 20 and the substrate 12.

Figure 12:
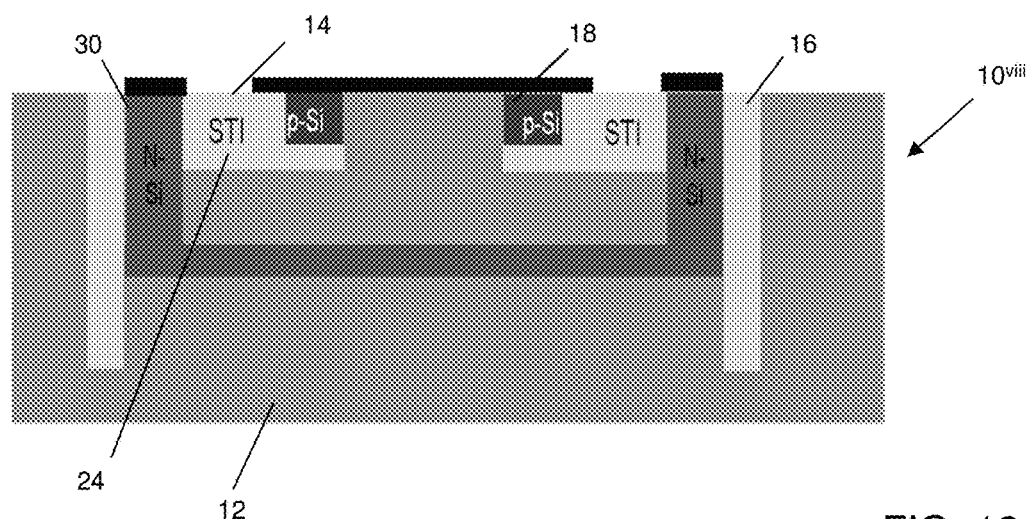
FIG. 12 shows a structure and respective processing steps in accordance with additional aspects of the present invention.

FIG. 12 shows a vertical Schottky barrier diode (SBD) $10^{viii}$ with a guard ring structure 18, i.e., p-Si layer. In embodiments, the guard ring structure 18 is formed using P-type materials, as already described herein. In this embodiment, the P-type regions 18 can be heavily doped, e.g., high energy boron implantation process, e.g., 2E19 or greater, as described with regard to the processes shown in FIG. 1 (e.g., which makes the P-type regions (guard ring structure 18) resistant to a lateral undercut etching of the underlying substrate 12). In this way, much like described with regard to FIGS. 2-4, an anisotropic etching process is performed to form shallow openings through the P-type region 18 or on sides thereof or through the dielectric adjacent to p-type guard ring, followed by a lateral etching process, selective to the substrate 12. In this way, for example, undercuts are formed in the substrate 12, under the P-type regions 18, e.g., anodes. The etch chemistry is a KOH etch based chemistry or similar etchant that is selective to the substrate 12, e.g., Si material. The openings and undercuts are filled with an insulation material 24 to isolate the P-type regions 18 from the substrate 12. In embodiments, the insulation material can be an oxide based material or Boron Phosphate Silicate Glass (BPSG), depositing using conventional deposition processes, e.g., chemical vapor deposition (CVD) or plasma enhanced CVD (PECVD). The Schottky Diode further includes an n-type ohmic contact 30, formed in a conventional manner as described herein, e.g., doping with n-type dopants.

Figure 13:
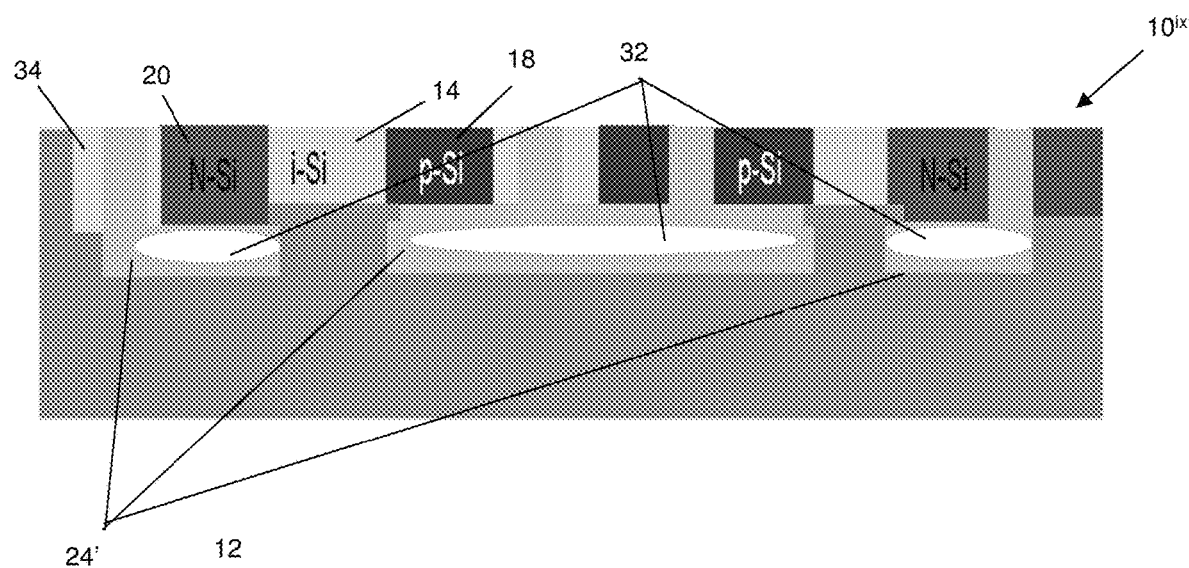
FIG. 13 shows a structure and respective processing steps in accordance with additional aspects of the present invention.

In FIG. 13, the structure (lateral PiN diode) $10^{ix}$ includes air gaps 32 in the isolation structures 24'. This provides an alternative mechanism for isolating the P-type regions 18 and the N-type regions 20 from the substrate 12. In these embodiments, the P-type regions 18 and the N-type regions 20 can be formed in any of the processes described herein, e.g., including for example, i-SiGe epi layer or heavy doping of the N or P regions.

In the processes of forming the structure (lateral PiN diode) $10^{ix}$ of FIG. 13, narrow trench etches are provided through wide shallow trench isolation (STI) regions 34. A lateral undercut etch is then performed, as already described herein. The layer 14, e.g., Si and/or SiGe is exposed to a surface passivation. Dielectric deposition is then performed to fill the lateral undercut (also referred to as cavities and/or trenches). The dielectric material will pinch off at the trench opening to seal the isolation structures, which are generally partially filled with dielectric films with an air gap 32. In an optional step, the openings can be provided with a spacer on the sidewall of the trench.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising a diode with breakdown voltage determined by a dimension between p-terminals formed in an i-region above a substrate, wherein the p-terminals are isolated from the substrate by lateral undercut isolation regions, the lateral undercut isolation regions being filled with an insulation material, wherein the diode is a vertical schottky barrier diode with an insulated undercut below a p+ guard ring for reduced parasitic capacitance.

2. The structure of claim 1, wherein the p-terminals are self aligned.

3. The structure of claim 1, wherein:
the p-terminals are heavily doped ion implanted regions resistant to a lateral undercut etch selective to the substrate.

4. The structure of claim 1, wherein the i-region is one of i-Si, i-SiGe, i-SiGeC, and i-SiC grown directly on the underlying substrate.

5. The structure of claim 1, wherein the substrate comprises silicon.

6. The structure of claim 5, wherein the i-region directly contacts the substrate.

7. The structure of claim 1, further comprising an ohmic contact.

8. The structure of claim 7, wherein the ohmic contact is an n-type ohmic contact.

9. The structure of claim 7, wherein the ohmic contact extends between the insulation material and the substrate.

10. The structure of claim 7, wherein the ohmic contact extends between the insulation material and a deep trench isolation structure.

11. A structure, comprising:
a substrate;

an i-region comprising one of i-Si, i-SiGe, i-SiGeC, and i-SiC, formed above the substrate;
a first lateral PiN diode comprising a first p-terminal formed in the i-region at a first distance from a first n-terminal formed in the i-region; and
a second lateral PiN diode comprising a second p-terminal formed in the i-region at a second distance from a second n-terminal formed in the i-region, wherein:
the first distance is greater than the second distance;
the first distance forms a high breakdown voltage region for the first lateral PiN diode; and
the second distance forms a low breakdown voltage region for the second lateral PiN diode,
wherein the first and second p- and n-terminals are isolated from the substrate by lateral undercut isolation regions, each of the lateral undercut isolation regions having an air gap therein, and
the lateral undercut isolation regions comprise a first lateral undercut isolation region extending through a first shallow trench isolation (STI) region and below the first n-terminal, the first lateral undercut isolation region comprising an air gap underneath the first n-terminal.

12. The structure of claim 11, wherein at least one of:
the first and second p-terminals are heavily doped ion implanted regions resistant to a lateral undercut etch selective to the substrate; and
the first and second n-terminals are heavily doped ion implanted regions resistant to the lateral undercut etch selective to the substrate.

13. The structure of claim 11, wherein the lateral undercut isolation regions comprise a second lateral undercut isolation region extending through a second shallow trench isolation (STI) region and below the first p-terminal, the second lateral undercut isolation region comprising an air gap underneath the first p-terminal.

14. The structure of claim 13, wherein the second lateral undercut isolation region extends below the first p-terminal and the second p-terminal.

15. The structure of claim 14, wherein the air gap in the second lateral undercut isolation region is underneath the first p-terminal and the second p-terminal.

16. A method, comprising:
forming p-terminals and n-terminals in an i-region at different distances to form a high breakdown voltage region and a low breakdown voltage region in an underlying substrate;
etching an opening into the substrate;
selectively etching a lateral undercut in the underlying substrate, under at least one of the p-terminals and n-terminals to remove its direct connection to the underlying substrate; and
at least partially filling the lateral undercut under the at least one of the p-terminals and n-terminals with insulation material to provide an isolation structure under the at least one of the p-terminals and n-terminals.

17. The method of claim 16, wherein the p-terminals are heavily doped regions which make them resistant to the lateral undercut etch of the underlying substrate.

18. The method of claim 16, wherein the i-region is one of i-Si, i-SiGe, i-SiGeC, and i-SiC grown directly on the underlying substrate.

* * * * *